United States Patent
Smit et al.

(10) Patent No.: US 10,314,208 B2
(45) Date of Patent: Jun. 4, 2019

(54) COOLING DEVICE, METHOD FOR PRODUCING A COOLING DEVICE AND POWER CIRCUIT

(71) Applicant: Continental Automotive GmbH, Hannover (DE)

(72) Inventors: Arnoud Smit, Nuremburg (DE); Thomas Schmid, Regensburg (DE); Lars Keller, Aiterhofen (DE); Soeren Rittstieg, Neutrabling (DE)

(73) Assignee: CONTINENTAL AUTOMOTIVE GMBH, Hanover (DE)

( * ) Notice: Subject to any disclaimer, the term of this patent is extended or adjusted under 35 U.S.C. 154(b) by 0 days.

(21) Appl. No.: 15/325,266

(22) PCT Filed: Apr. 2, 2015

(86) PCT No.: PCT/EP2015/057295
§ 371 (c)(1),
(2) Date: Jan. 10, 2017

(87) PCT Pub. No.: WO2016/005065
PCT Pub. Date: Jan. 14, 2016

(65) Prior Publication Data
US 2017/0196117 A1 Jul. 6, 2017

(30) Foreign Application Priority Data
Jul. 10, 2014 (DE) .................. 10 2014 213 490

(51) Int. Cl.
*B32B 15/00* (2006.01)
*B23K 35/00* (2006.01)
(Continued)

(52) U.S. Cl.
CPC ............... *H05K 7/209* (2013.01); *F28F 3/12* (2013.01); *F28F 21/084* (2013.01);
(Continued)

(58) Field of Classification Search
None
See application file for complete search history.

(56) References Cited

U.S. PATENT DOCUMENTS

| 4,702,969 A | 10/1987 | Bunkoczy et al. ........... 428/635 |
| 5,339,519 A | 8/1994 | Fortune ......................... 29/840 |

(Continued)

FOREIGN PATENT DOCUMENTS

| CN | 200968797 Y | 10/2007 | |
| CN | 102593080 A | 7/2012 | ............. C23C 24/04 |

(Continued)

OTHER PUBLICATIONS

Yamaguchi et al., Machine translation of JP 2008-1866356 Description, Jul. 17, 2008 (Year: 2008).*

(Continued)

*Primary Examiner* — David Sample
*Assistant Examiner* — Mary I Omori
(74) *Attorney, Agent, or Firm* — Slayden Grubert Beard PLLC

(57) ABSTRACT

The present disclosure relates to cooling devices. The teachings thereof may be embodied in methods for producing cooling devices and power circuits equipped with a cooling device. Embodiments may include cooling device having an aluminum cooling element; and at least one nickel metal sheet connected to the aluminum cooling element by a solder layer; wherein the cooling device includes a mounting surface formed by a side of the at least one nickel metal sheet facing away from the aluminum cooling element.

9 Claims, 1 Drawing Sheet

(51) Int. Cl.
  *H05K 7/20* (2006.01)
  *F28F 3/12* (2006.01)
  *F28F 21/08* (2006.01)
  *H01L 23/373* (2006.01)
  *H01L 23/473* (2006.01)
  *H05K 1/02* (2006.01)
  *F28F 13/00* (2006.01)

(52) U.S. Cl.
  CPC ........ *F28F 21/087* (2013.01); *H01L 23/3735* (2013.01); *H01L 23/3736* (2013.01); *H01L 23/473* (2013.01); *H05K 1/0209* (2013.01); *F28F 2013/006* (2013.01); *F28F 2265/26* (2013.01); *F28F 2275/04* (2013.01); *F28F 2275/06* (2013.01); *H01L 2224/32225* (2013.01)

(56) References Cited

U.S. PATENT DOCUMENTS

| | | | |
|---|---|---|---|
| 7,087,316 B2 | 8/2006 | Yoshida et al. | 428/620 |
| 7,154,753 B2 | 12/2006 | Kobayashi | 361/715 |
| 8,772,926 B2 | 7/2014 | Otaki et al. | 257/712 |
| 8,883,318 B2 | 11/2014 | Yamamoto et al. | 428/652 |
| 2005/0022978 A1 | 2/2005 | Duval | 165/104.26 |
| 2005/0031889 A1* | 2/2005 | Yoshida | H01L 23/3735 428/610 |

FOREIGN PATENT DOCUMENTS

| | | | | |
|---|---|---|---|---|
| CN | 203689311 U | 7/2014 | | |
| DE | 10340837 A1 | 5/2004 | | |
| DE | 102013208350 A1 | 11/2013 | | B23K 1/00 |
| DE | 102012107570 A1 | 2/2014 | | |
| EP | 1372368 A1 | 12/2003 | | |
| EP | 1696526 A1 | 8/2006 | | |
| JP | 0677679 A | 3/1994 | | H01L 23/36 |
| JP | 06252573 A | 9/1994 | | H01L 23/40 |
| JP | 1131768 A | 2/1999 | | H01L 23/427 |
| JP | 1187584 A | 3/1999 | | F28F 9/04 |
| JP | 2004221256 A | 8/2004 | | H05K 1/02 |
| JP | 2007294666 A | 11/2007 | | F28D 1/03 |
| JP | 2008072006 A | 3/2008 | | B23K 1/00 |
| JP | 2008166356 A | 7/2008 | | H01L 23/36 |
| JP | 2010109278 A | * | 5/2010 | |
| JP | 2011114157 A | * | 6/2011 | |
| JP | 2013016525 A | 1/2013 | | B23K 1/00 |
| JP | 2013036099 A | * | 2/2013 | |
| WO | 2007/036963 A1 | 4/2007 | | |
| WO | 2011/052517 A1 | 3/2013 | | B23K 1/00 |
| WO | 2016/005065 A1 | 1/2016 | | |

OTHER PUBLICATIONS

Kuroda et al., Machine translation of JP 2013-036099 Description, Feb. 21, 2013 (Year: 2013).*
Hotta, Koji, Machine translation of JP 2010-109278 Description, May 13, 2010 (Year: 2010).*
Ishibashi et al., machine translation of JP 2011-114157 Abstract and Description, Jun. 9, 2011 (Year: 2011).*
International Search Report and Written Opinion, Application No. PCT/EP2015/057295, 18 pages, dated Aug. 12, 2015.
Korean Office Action, Application No. 2018008812464, 14 pages, dated Feb. 5, 2018.
Chinese Office Action, Application No. 201580037472.7, 14 pages, dated Oct. 9, 2018.
Korean Notice of Allowance, Application No. 20177000639, 3 pages, dated Sep. 28, 2018.

* cited by examiner

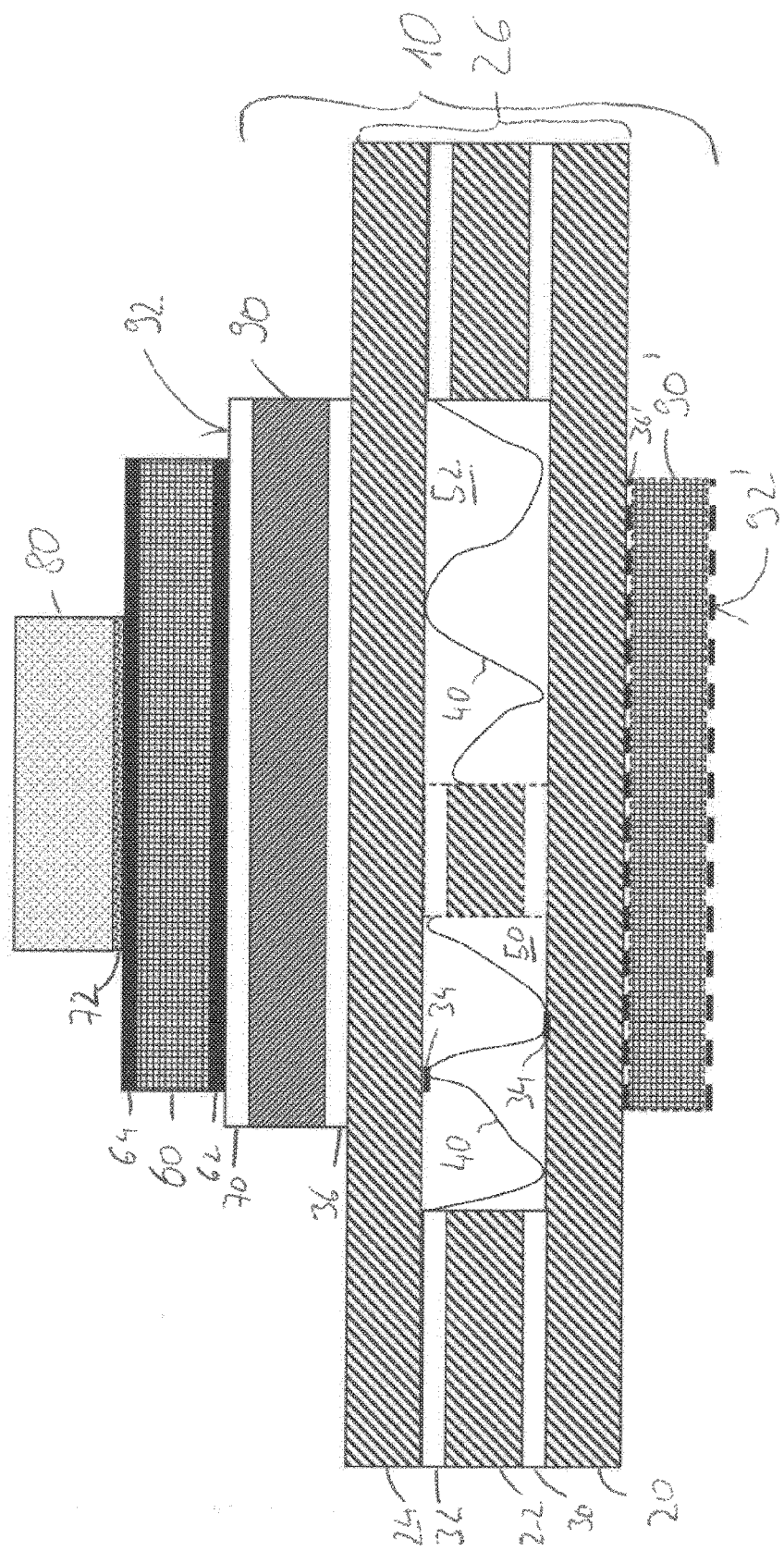

COOLING DEVICE, METHOD FOR PRODUCING A COOLING DEVICE AND POWER CIRCUIT

CROSS-REFERENCE TO RELATED APPLICATIONS

This application is a U.S. National Stage Application of International Application No. PCT/EP2015/057295 filed Apr. 2, 2015, which designates the United States of America, and claims priority to DE Application No. 10 2014 213 490.0 filed Jun. 10, 2014, the contents of which are hereby incorporated by reference in their entirety.

TECHNICAL FIELD

The present disclosure relates to cooling devices. The teachings thereof may be embodied in methods for producing cooling devices and power circuits equipped with a cooling device.

BACKGROUND

In automotive applications, electrical or electronic circuits, power semiconductors, other electronic or electrical components must be cooled to remove the heat generated during operation, usually dissipated by cooling elements. The cooling elements are conventionally made from aluminum owing to the good heat conduction properties, whilst the circuit is formed by a copper-based printed circuit board or comparable carriers. To ensure a good heat transfer, the copper layers are mounted in a planar manner on the aluminum cooling elements. As a result of the different thermal expansion coefficients, temperature cycles may induce separation between the metals, which have a negative influence on the service life and reliability.

SUMMARY

The teachings of the present disclosure may enable the production of cooled circuits with a longer service life.

Some embodiments may include a cooling device (10), which has an aluminum cooling element (26) and at least one nickel metal sheet (90, 90') which is connected to the aluminum cooling element (26) by means of a solder layer (36), wherein the cooling device (10) has a mounting surface (92, 92') for mounting purposes and for heat absorption, which is formed by a side of the nickel metal sheet (90) which faces away from the aluminum cooling element (26).

In some embodiments, the at least one nickel metal sheet (90, 90') is connected directly to the aluminum cooling element (26) by means of the solder layer (36).

In some embodiments, the aluminum cooling element (26) is formed by a plurality of aluminum sheets (20, 22, 24) which are stacked above one another and connected to one another, wherein at least one aluminum sheet (22) has cutouts (50) which form a cooling channel which is covered by at least one of the aluminum sheets (20, 24).

In some embodiments, the aluminum sheets are connected to one another by means of solder layers (30, 32).

In some embodiments, the aluminum sheets (20-24) are rolled aluminum sheets, which may be soldered by means of hard solder.

In some embodiments, the nickel metal sheet (90, 90') contains at least 70%, 85% and preferably at least 95%, 98% or 99% by mass of nickel, or the nickel metal sheet has a metal core and a nickel layer which surrounds this metal core and which contains at least 70%, 85% and preferably at least 95%, 98% or 99% by mass of nickel.

In some embodiments, the nickel metal sheet (90, 90') has a thickness of at least 200, 500 or 800 μm.

Some embodiments may include methods for producing a cooling device (10) as described above. Methods may include: (a) applying solder material to a connecting surface of at least one aluminum sheet (20, 22, 24); (b) stacking aluminum sheets (20, 22, 24) which comprise the at least one aluminum sheet to which the solder material has been applied; (c) melting the solder material to form at least one solder layer (30, 32) between the aluminum sheets by heating the aluminum sheets (20, 22, 24) together with the solder material, whereby the aluminum cooling element (26) is generated as a stacked aluminum sheet structure, wherein the method furthermore comprises: (d) arranging the nickel metal sheet (90, 90') on one of the aluminum sheets (24) which forms an outer side of the aluminum cooling element (26), wherein solder material is located between the nickel metal sheet (90) and the aluminum sheet (24), and wherein the solder material which is located between the nickel metal sheet (90) and the aluminum sheet (24) is melted by the heating procedure of step (c) to form a solder layer (36) between the nickel metal sheet (90, 90') and the aluminum cooling element (26).

In some embodiments, before the stacking procedure, at least one of the aluminum sheets (22) is punched to form a cooling channel by means of the surrounding aluminum sheets (20, 24) as a result of the stacking procedure.

In some embodiments, the power circuit furthermore has a printed circuit board (60) with a conductive layer (62, 64) on both sides, which printed circuit board is connected to the nickel metal sheet (90) by way of a solder layer (70), and wherein the power circuit furthermore has at least one semiconductor (80) which is mounted on the printed circuit board (60) on the side of the printed circuit board (60) which faces away from the nickel metal sheet (90).

In some embodiments, the semiconductor (80) is a power semiconductor in the form of an unhoused semiconductor, which is mounted on the printed circuit board by means of a soft solder layer (62).

BRIEF DESCRIPTION OF THE DRAWINGS

FIG. 1 shows an example power circuit with a cooling element associated with the power circuit in cross-section in accordance with the teachings of the present disclosure.

DETAILED DESCRIPTION

Mechanical stresses between an aluminum cooling element and a copper layer of the printed circuit board mounted thereon are responsible for failures and, therefore, the reliability can be increased by reducing the stresses. Teachings of the present disclosure may be employed to reduce the mechanical stresses between the cooling element and the copper layer of the printed circuit board which may be applied to the cooling element by means of a nickel metal sheet which establishes the connection between these two components (or the copper layer). By using a metal sheet (whereof the thickness exceeds the thickness of a galvanized nickel layer, for instance), the stress can be relieved along the thickness of the metal sheet. The thickness of the metal sheet enables a deformation in a direction of the longitudinal extent of the metal sheet (in contrast to thin solder simplification layers). The nickel metal sheet can be deformed on the side connected to the cooling element with respect to the opposing side of the metal sheet, whereby stress is absorbed and thus also relieved. This therefore makes use of the resilient properties of the nickel which are exhibited by the metal sheet in its thickness direction (e.g., perpendicularly to the directions of the longitudinal extent). Likewise, the side of the metal sheet which faces away from the cooling element provides improved solder properties for mounting copper. The metal sheet therefore also enables a material transition.

In some embodiments, a cooling device may comprise an aluminum cooling element and at least one nickel metal sheet. The cooling device is designed for mounting on a circuit, e.g., on a copper layer of a circuit arrangement. The nickel metal sheet here forms the (planar) heat transfer interface in the form of a mounting surface on which the copper layer is mounted. The at least one nickel metal sheet is soldered onto the aluminum cooling element, e.g., by means of a solder layer. This connects the nickel metal sheet (directly) to the aluminum cooling element. The solder layer may include a hard solder layer.

The cooling device has a mounting surface for mounting purposes and for heat absorption, which has the function of a heat transfer interface. The mounting surface may be formed by one side of the nickel metal sheet. This side faces away from the aluminum cooling element (and therefore also the solder layer between the metal sheet and the cooling element). This side may be substantially flat, although it can also be adapted to the progression of the printed circuit board to be applied. The thickness of the nickel metal sheet may be substantially the same at each point of the metal sheet (e.g., with a tolerance of no greater than +/−1% and/or +/−0.1%).

One or more nickel metal sheets can be mounted on the cooling element (in particular by means of a solder layer). A plurality of nickel metal sheets can be mounted directly or at a mutual spacing on the surface of the cooling element. A plurality of nickel metal sheets can be provided on the same side, on different sides or on opposing sides of the cooling element. In some embodiments, a respective nickel metal sheet, or a plurality of respective nickel metal sheets, can be mounted on opposing (e.g., mutually parallel) sides of the cooling element.

As already noted, the at least one nickel metal sheet is mounted with material fit on the cooling element, in particular by means of a material-fitting connection such as a solder connection (e.g., by means of a solder layer). In particular, the cooling element is provided on both sides with at least one nickel metal sheet to enable printed circuit boards or circuits to be applied on both sides. The cooling element may be planar and may be substantially cuboidal. The cooling element can have cooling fingers to emit heat at the outer side of the cooling element and at the cooling fingers to a surrounding heat medium (air), and/or it can have a cooling channel which extends through the cooling element to emit heat to a heat medium (liquid, in particular oil or water) which flows through the cooling channel.

The aluminum cooling element can be formed by a plurality of aluminum sheets. These are stacked above one another. These are furthermore connected to one another, e.g., by means of a hard solder layer. At least one aluminum sheet has cutouts. The at least one aluminum sheet which has cutouts is covered on both sides by a further two of the aluminum sheets or is covered by the aluminum sheet on one side and by the metal sheet on the other side. The cutouts form a cooling channel. The cutouts extend through the entire thickness of the aluminum sheet or only through part of the relevant aluminum sheet. The cutout is for instance in the form of a groove. The cutout leads to the edge of the aluminum sheet.

The cutout can have a meandering longitudinal progression, wherein the longitudinal progression of the cutout extends in one, and preferably two different directions of the longitudinal extent of the aluminum sheet. The cutouts therefore may extend in a planar manner. The cutouts can be formed in one or two directions in accordance with a grid. The cutouts are, for example, punched or milled or even cast.

The aluminum sheets are connected to one another by means of solder layers. The solder layers seal the aluminum sheets with respect to one another. Another sealing element (a layer of resilient sealing material such as silicone, for instance) can also be provided between the aluminum sheets, with the aluminum sheets being connected to one another by means of mounting elements, for instance a screw connection which extends through the aluminum sheets. One of the aluminum sheets can have planar or rod-shaped cooling fins which project into the cooling channel. A design having rod-shaped cooling fins is also known as a pin fin structure, wherein the cooling fins are distributed in a planar (and preferably uniform) manner. The cooling fins may extend in the interior of the aluminum cooling element, e.g., into the at least one cooling channel, and can therefore also be regarded as turbulators (in functional terms).

The aluminum sheets may include rolled aluminum sheets, which may be soldered by means of hard solder. The cooling element and the aluminum sheets may have a melting point of at least 590° C., with aluminum containing 8-15% by mass of silicon being used as hard solder (for connecting the aluminum sheets and/or for mounting the nickel metal sheet as a solder layer). The hard solder may have a casting temperature of 670-740° C. and a solidification range of 570-590° C. AlSi12 can be used as hard solder. All Al alloys containing 7-13% by mass of silicon may be suitable as hard solder. Moreover, the melting range of the hard solder can be 575° C.-615° C.

In some embodiments, the cooling element and in particular the aluminum sheets may contain less than 2% by mass of magnesium, thereby achieving good usability (with solder material). The cooling element and the aluminum sheets may contain at least 70% by mass of aluminum to ensure the corrosion resistance. Rolled (or even cast) aluminum sheets can be used, including AlMg5Si2Mn. The lower melting limit of the aluminum sheets is, in this case, for example 594° C. If the aluminum element is not formed as an aluminum sheet stack, it can be made from the material from which the aluminum sheets mentioned here are made. The details above therefore relate equally to aluminum sheets and the aluminum cooling element.

The terms "aluminum sheets" and "aluminum cooling element" contain the word "aluminum", thereby indicating that the main constituent is aluminum. Therefore, the use of the word "aluminum" does not refer to an aluminum content of 100% (by mass), but can refer to an alloy which consists predominantly of aluminum wherein, as mentioned, additives are not excluded.

The at least one nickel metal sheet may contain at least 70%, 85% or even at least 95%, 98% or 99% by mass of nickel. The nickel metal sheet can have a metal core and a nickel layer which surrounds this metal core. The content by mass of nickel in the nickel layer is at least 70%, 85% or even at least 95%, 98% or 99%. The heat conductivity of the nickel metal sheet may be at least 70, 75 and/or at least 85 or 90 W/m*K. The nickel metal sheet can have a hard solder layer on one side (directed towards the aluminum cooling element) or on both sides, before it is connected to the aluminum cooling element or to the relevant aluminum sheet. The nickel metal sheet can have a hard solder layer directed towards the aluminum cooling element and a soft solder layer on the opposing side. This nickel metal sheet, which is provided with at least one solder layer (or an appropriate solder material) in this way, is stacked and soldered together with the aluminum cooling element (for instance in a furnace).

The nickel metal sheet can have a thickness of at least 200, 500, 800 µm. In some embodiments, sheet thicknesses (in the sense of fine sheets) of ca. 1 mm or 1.5 mm are used. The nickel metal sheet (and also the at least one aluminum sheet) can be generated by separating, e.g., by cutting or punching a band or a strip of the relevant material.

Some embodiments may include cooling channels, which have a free internal cross-section or in which turbulators are incorporated. The turbulators are physically discrete elements (for instance a folded metal sheet) connected to the internal wall of the cooling channel, or are formed by lateral cutouts, or are formed by element portions which project into the channel.

A method for producing a cooling device described here is furthermore explained. Within the framework of the method, solder material is applied to a connecting surface of at least one aluminum sheet, for instance by pressing or rolling, by applying or inserting a preform as a sheet or film which forms the solder material (in particular the hard solder material within the cooling device). The aluminum sheets are stacked. In some embodiments, the aluminum sheets which are already provided with solder material are stacked or the aluminum sheets are stacked alternately with the solder material formed as a sheet or film. The solder material is melted to form at least one solder layer between the aluminum sheets. This is carried out for example by heating the aluminum sheets together with the solder material, for instance in a furnace. The furnace can be evacuated or it can have a nitrogen atmosphere in the interior. As a result, the aluminum cooling element is generated as a stacked aluminum sheet structure. Flux can be used, in particular in addition to the solder material.

Within the framework of the method, the at least one nickel metal sheet is furthermore placed on one of the aluminum sheets, in particular on one of the aluminum sheets which forms an outer side of the aluminum cooling element. Solder material is located here between the nickel metal sheet and the aluminum sheet. Provision can therefore be made for solder material to be applied to the connecting surface of the nickel metal sheet or the relevant aluminum sheet. The solder material located between the nickel metal sheet and the aluminum sheet is fused in the same step as the solder material between the aluminum sheets. The solder material located between the nickel metal sheet and the aluminum sheet and the solder material between the aluminum sheets can therefore be heated and fused in one and the same step, for instance by introducing the stacked aluminum sheets and the at least one nickel metal sheet into a furnace which heats, and thereby fuses, the solder material. A solder layer is formed between the nickel metal sheet and the aluminum cooling element, in particular in one and the same heating step (for instance in a furnace).

At least one of the aluminum sheets can be punched before the stacking procedure. The cutouts, which form the cooling channel which is terminated by adjacent sheets or metal sheets, are formed as a result of the punching procedure. This aluminum sheet is inserted between two aluminum sheets or between an aluminum sheet and the nickel metal sheet in the course of the stacking procedure. A cooling channel is formed by means of the surrounding aluminum sheets (or by means of the surrounding aluminum sheet and the nickel metal sheet) as a result of the stacking procedure. The cutouts which, together with the adjacent components, form the at least one cooling channel are generated as a result of the punching procedure.

A turbulator (as a discrete element) can furthermore be inserted into the cutout and/or mounted therein in the course of the stacking procedure. Solder material can be introduced here between the turbulator and the adjoining aluminum sheet or nickel metal sheet so that, together with the solder material between the aluminum sheets and the solder material between the nickel metal sheet and one of the aluminum sheets, the solder material between the turbulator and the adjoining sheet or metal sheet is also fused to form a solder layer. A solder material of hard solder is used here, in particular an aluminum solder which contains silicon. The solder material may have a melting point of at least 450° C.

In a subsequent step, a printed circuit board or other carrier having a copper conductive layer (or even simply a copper conductive layer itself) can be soldered onto the nickel metal sheet by soft soldering. The temperature here is below the melting point of the solder material mentioned above.

Some embodiments may include a power circuit which has a cooling device, as mentioned here, with an aluminum cooling element and a nickel metal sheet, which power circuit furthermore has a printed circuit board. The printed circuit board is provided on both sides with a conductive layer, e.g., a copper conductive layer. The conductive layer and therefore also the printed circuit board are connected by way of a solder layer (e.g., soft solder) to the nickel metal sheet, in particular to the mounting surface which is formed by the nickel metal sheet. The power circuit furthermore has at least one semiconductor or other electrical or electronic component which is mounted on the printed circuit board on the side of the printed circuit board which faces away from the nickel metal sheet (e.g., on the opposing conductive layer). The solder layer between the printed circuit board and the mounting surface, or between the component and the printed circuit board may comprise soft solder. An Sn-based soft solder can be used, e.g., with an Ag additive, soft solder from the group SnAg3.5, alternatively with the variations SnAg3Cu0.5 and Sn95.75Ag3.5Cu0.75.

The semiconductor can be a power semiconductor in the form of an unhoused semiconductor. This is mounted on the printed circuit board by means of a soft solder layer. The semiconductor (or the component) can be soldered on the printed circuit board in the same step in which the printed circuit board is also soldered onto the cooling device (or onto the aluminum cooling element or onto the mounting surface/the nickel metal sheet) by heating the relevant (soft) solder material in a furnace (together with the cooling device, the printed circuit board and the semiconductor/the component). During this, the temperature provided in the furnace is higher than the melting point of the solder material between the component and the printed circuit board and the solder material between the printed circuit board and the cooling element, and lower than the melting point of the solder material or the solder layers which are located within the cooling device.

The power circuit may form an electric motor power control of a vehicle, a voltage or current power converter in a vehicle wiring system, or an inverter or rectifier circuit.

The power circuit may have a multi-phase design, e.g., a three-phase design. The power circuit refers in particular to circuits which have a current carrying capacity for currents of at least 50 A, 100 A, 200 A, or 500 A.

Direct copper bonded printed circuit boards may be used as the printed circuit board, with printed circuit boards having a copper lamination also being an option. The use of substrates as printed circuit boards is possible, in which substrates the conductive layer is initially structured as an individual sheet wherein individual conductive paths or the connecting structure are produced, for instance, by punching and this connecting structure is then connected to the substrate, for instance by insert molding the connecting structure with the material of the (electrically insulating) substrate.

FIG. 1 shows, in cross-section, an example cooling device 10 which comprises a plurality of aluminum sheets 20, 22, 24 stacked above one another. The aluminum sheets (including associated elements such as solder layers, inlet, outlet, turbulators, mounting elements, . . . ) form an aluminum cooling element. The aluminum sheets are stacked flush above one another. The aluminum sheet 22 which lies between the aluminum sheets 20 and 24 has cutouts 50, 52 which form a cooling channel. This cooling channel reaches to an outer surface of the cooling element 10 to an edge which lies offset from the plane of the drawing (and is therefore not illustrated). Cooling device 10 may include an inlet and an outlet located at the ends of the cooling channel.

The aluminum sheets 20-24 are connected to one another by means of solder layers 30 and 32, with a respective solder layer lying between two adjacent aluminum sheets. The solder layer is located at the point where the aluminum sheets also abut against one another, with it also being possible to do without a solder material or a solder layer at the cutouts 50, 52. Turbulators 40 formed from corrugated sheet as illustrated may be located within the cutouts 50, 52. These turbulators 40 are connected to the adjoining aluminum sheets 20, 24 by way of individual solder layer portions 34. The turbulators 40 are, however, optional and may be omitted. The cutouts 50, 52 extend through the entire thickness of the intermediate aluminum sheet 22. As a result, the cutouts 50, 52 likewise form a respective cooling channel (or cooling channel portion of a common cooling channel), which is terminated by the sheets 20, 24 between which the sheet 22 having the cutouts lies.

Located at an outer side of the stacked aluminum sheets on a main surface of an outer-lying aluminum sheet 20, 24 which faces away from the cutouts 50, 52, is a nickel metal sheet 90 which is connected to the aluminum sheet 24 by way of a solder layer 36. The solder layers 30-36 are hard solder layers and can be generated within a furnace in a common melting process.

The nickel metal sheet 90 forms a mounting surface 92, which faces away from the aluminum sheets 20-24. This mounting surface 92 is formed by an upper side of the nickel metal sheet 90 and by a surface of the nickel metal sheet 90 which is provided with a solder layer 70. The solder layer 70 may comprise soft solder. Electronic or electrical components to be cooled can be mounted on the mounting surface.

In addition to the cooling element 10, FIG. 1 shows a populated printed circuit board 60 located on the mounting surface 92. Therefore, in addition to the cooling element 10, FIG. 1 also shows a power circuit comprising the cooling element 10 and forming the power circuit. The printed circuit board 60 is a printed circuit board coated on both sides with a first conductive layer 62 and a second conductive layer 64. The first conductive layer 62 is connected to the nickel metal sheet 90 by way of the soft solder layer 70 so that the printed circuit board 60 is connected to the mounting surface of the cooling element 10 by way of the first conductive layer 62. The opposing, second conductive layer 62 serves for mounting a semiconductor 80 which is also representative of other electrical or electronic components, e.g., power components. A solder layer 72, like the layer 70, formed as a soft solder layer, connects the semiconductor 80 to the second conductive layer 64 facing away from the cooling element 10. The semiconductor 80 is an unhoused semiconductor, for instance a transistor, e.g., an IGBT or a MOSFET. The semiconductor 80 is merely an example representing a number of components which can be mounted on the printed circuit board 60.

For better illustration, the printed circuit board 60 has been illustrated narrower than the nickel metal sheet in FIG. 1, with it being possible for the printed circuit board to extend beyond the solder layer and also beyond the cooling element 10 in further embodiments. In particular, power semiconductors or power components which generate heat to be dissipated may be arranged over the mounting surface 92 here so that the heat-conducting path for the heat to be dissipated is short.

The cooling element 10 may include a nickel metal sheet 90, and therefore a mounting surface 92, on one side, but it can also be provided with nickel metal sheets on both sides. The optional nickel metal sheet 90', which is located opposite the nickel metal sheet 90 on the opposing side of the aluminum element (formed by the aluminum layers 20-24), is illustrated here by way of example. This second nickel metal sheet 90' has a further mounting surface 92' on which components or printed circuit boards can be mounted to dissipate their heat. Like the nickel metal sheet 90, the nickel metal sheet 90' is connected to the aluminum cooling element (e.g., to the aluminum sheets) by means of a hard solder layer 36'. As already noted, the aluminum cooling element is formed by the aluminum sheets 20, 22 and 24 and the solder layers 30 and 32 lying between them, including the turbulators 40 where applicable. In further embodiments (not illustrated), the aluminum cooling element can also be illustrated in a manner other than by interrupted aluminum sheets, for instance by a continuous aluminum element or by an aluminum element in which cooling channels are incorporated. In addition to internal cooling channels, the aluminum cooling element can also have cooling fins, in particular on the surface of the aluminum cooling element, so that, alternatively or additionally, heat may be dissipated by the surface of the cooling element (and not only by way of the cooling channels).

LIST OF REFERENCE SIGNS

10 Cooling device
20, 22, 24 Aluminum sheets
26 Aluminum cooling element
30, 32, 36 Solder layers, in particular hard solder layers
34 Hard solder layers for mounting the turbulators
40 Turbulators
50, 52 Cutouts in the aluminum sheet or in the aluminum cooling element 26
60 Printed circuit board
62, 64 Conductive layers of the printed circuit board 60
70, 72 Solder layers, in particular soft solder layers
80 Semiconductor, preferably unhoused
90, 90' Nickel metal sheet
92, 92' Mounting surface

What is claimed is:

1. A cooling device comprising:
   an aluminum cooling element;
   a nickel metal sheet soldered directly to the aluminum cooling element, wherein the nickel metal sheet contains at least 95% by mass of nickel and the nickel metal sheet has a thickness of at least 200 μm; and
   a mounting surface defined by a side of the nickel metal sheet facing away from the aluminum cooling element.

2. The cooling device as claimed in claim 1, wherein:
   the aluminum cooling element comprises a plurality of aluminum sheets stacked above one another and connected to one another; and
   at least one aluminum sheet includes cutouts forming a cooling channel covered by a second at least one of the aluminum sheets.

3. The cooling device as claimed in claim 2, wherein the aluminum sheets are connected to one another by solder layers.

4. The cooling device as claimed in claim 2, wherein the aluminum sheets comprise rolled aluminum sheets soldered by hard solder.

5. A method for producing the cooling device of claim 1, the method comprising:
   applying a solder material to a connecting surface of a plurality of aluminum sheets;
   stacking the plurality of aluminum sheets;
   melting the solder material to form at least one first solder layer between two respective aluminum sheets by heating the stacked aluminum sheets and the solder material, forming the aluminum cooling element; and
   arranging the nickel metal sheet on an outer side of the aluminum cooling element, with solder material in direct contact with both the nickel metal sheet and the aluminum cooling element;
   wherein the solder material located between the nickel metal sheet and the aluminum cooling element melts during the heating of the stacked aluminum sheets to form a second solder layer directly connected to both the nickel metal sheet and the aluminum cooling element.

6. The method as claimed in claim 5, further comprising, before the stacking procedure, punching at least one of the aluminum sheets to form a cooling channel of the surrounding aluminum sheets once the aluminum sheets are stacked.

7. The cooling device as claimed in claim 1, wherein the nickel metal sheet includes a metal core and a nickel layer surrounding the metal core, the nickel layer containing at least 95% by mass of nickel.

8. A power circuit comprising:
   an aluminum cooling element;
   a nickel metal sheet directly soldered to the aluminum cooling element, wherein the nickel metal sheet contains at least 95% by mass nickel and the nickel metal sheet has a thickness of at least 200 μm;
   wherein the power circuit includes a mounting surface defined by a side of the nickel metal sheet facing away from the cooling element;
   a printed circuit board with a conductive layer applied on both sides, the printed circuit board connected to the nickel metal sheet by a solder layer; and
   at least one semiconductor mounted on the printed circuit board on a side of the printed circuit board facing away from the nickel metal sheet.

9. The power circuit as claimed in claim 8, wherein the at least one semiconductor comprises an unhoused semiconductor mounted on the printed circuit board by a soft solder layer.

* * * * *